(12) United States Patent
Dausch

(10) Patent No.: US 7,026,602 B2
(45) Date of Patent: *Apr. 11, 2006

(54) ELECTROMAGNETIC RADIATION DETECTORS HAVING A MICROELECTROMECHANICAL SHUTTER DEVICE

(75) Inventor: David E. Dausch, Raleigh, NC (US)

(73) Assignee: Research Triangle Institute, Research Triangle Park, NC (US)

(*) Notice: Subject to any disclaimer, the term of this patent is extended or adjusted under 35 U.S.C. 154(b) by 279 days.

This patent is subject to a terminal disclaimer.

(21) Appl. No.: 10/447,620

(22) Filed: May 29, 2003

(65) Prior Publication Data

US 2004/0046123 A1    Mar. 11, 2004

Related U.S. Application Data

(63) Continuation-in-part of application No. 09/834,825, filed on Apr. 13, 2001, now Pat. No. 6,586,738.

(51) Int. Cl.
*G01J 3/50* (2006.01)

(52) U.S. Cl. .................... 250/226; 250/237 R

(58) Field of Classification Search ............. 250/226, 250/237 R, 232, 214.1; 359/248, 254, 207, 359/230; 361/174, 196, 198

See application file for complete search history.

(56) References Cited

U.S. PATENT DOCUMENTS

| | | | |
|---|---|---|---|
| 3,471,641 A | 10/1969 | Baker et al. | |
| 3,772,537 A | 11/1973 | Clifford et al. | |
| 3,897,997 A | 8/1975 | Kalt | |
| 3,917,196 A | 11/1975 | Pond et al. | |
| 3,989,357 A | 11/1976 | Kalt | |
| 4,025,193 A | 5/1977 | Pond et al. | |
| 4,073,567 A | 2/1978 | Lakerveld et al. | |
| 4,094,590 A | 6/1978 | Kalt | |
| 4,105,294 A | 8/1978 | Peck | |
| 4,143,946 A | 3/1979 | Leo et al. | |

(Continued)

FOREIGN PATENT DOCUMENTS

DE     230159 C1    4/1983

(Continued)

OTHER PUBLICATIONS

Kurt E. Petersen, "Silicon Torsional Scanning Mirror," *IBM J. Res. Develop.* Sep. 1980, pp. 631-637, vol. 25 No. 5, San Jose, California.

(Continued)

*Primary Examiner*—Que T. Le
(74) *Attorney, Agent, or Firm*—Oblon, Spivak, McClelland, Maier & Neustadt, P.C.

(57) ABSTRACT

The present invention provides for an improved electromagnetic radiation detector having a micromachined electrostatic chopper/shutter device. The MEMS flexible film chopper/shutter device provides reliability, efficiency, noise reduction and temperature fluctuation compensation capabilities to the associated electromagnetic radiation detector. An electromagnetic radiation detector having an electrostatic chopper/shutter device includes a detector material element and flexible film actuator overlying the detector material layer and moveable relative thereto. The flexible film actuator will typically include an electrode element and a biasing element such that the actuator remains in a fully curled, open state absent electrostatic voltage and moves to a fully uncurled, closed state upon the application of electrostatic voltage. Arrays that incorporate a plurality of electromagnetic radiation detectors and/or electrostatic shuttering devices are additionally provided for.

46 Claims, 12 Drawing Sheets

U.S. PATENT DOCUMENTS

| | | | |
|---|---|---|---|
| 4,230,393 | A | 10/1980 | Burke, Jr. |
| 4,235,522 | A | 11/1980 | Simpson et al. |
| 4,248,501 | A | 2/1981 | Simpson |
| 4,266,339 | A | 5/1981 | Kalt |
| 4,317,611 | A | 3/1982 | Petersen |
| 4,336,536 | A | 6/1982 | Kalt et al. |
| 4,361,911 | A | 11/1982 | Buser et al. |
| 4,468,663 | A | 8/1984 | Kalt |
| 4,517,569 | A | 5/1985 | Gerharz |
| 4,564,836 | A | 1/1986 | Vuilleumier et al. |
| 4,618,223 | A | 10/1986 | Fried |
| 4,662,746 | A | 5/1987 | Hornbeck |
| 4,695,837 | A | 9/1987 | Kalt |
| 4,708,420 | A | 11/1987 | Liddiard |
| 4,710,732 | A | 12/1987 | Hornbeck |
| 4,732,440 | A | 3/1988 | Gadhok |
| 4,736,202 | A | 4/1988 | Simpson et al. |
| 4,762,426 | A | 8/1988 | Foss |
| 4,903,101 | A | 2/1990 | Maserjian |
| 5,061,049 | A | 10/1991 | Hornbeck |
| 5,083,857 | A | 1/1992 | Hornbeck |
| 5,097,354 | A | 3/1992 | Goto |
| 5,172,262 | A | 12/1992 | Hornbeck |
| 5,202,785 | A | 4/1993 | Nelson |
| 5,212,582 | A | 5/1993 | Nelson |
| 5,233,459 | A | 8/1993 | Bozler et al. |
| 5,274,379 | A | 12/1993 | Carbonneau et al. |
| 5,311,360 | A | 5/1994 | Bloom et al. |
| 5,408,355 | A | 4/1995 | Rauch et al. |
| 5,552,925 | A | 9/1996 | Worley |
| 5,568,307 | A | 10/1996 | Williams |
| 5,606,447 | A | 2/1997 | Asada et al. |
| 5,629,790 | A | 5/1997 | Neukermans et al. |
| 5,629,918 | A | 5/1997 | Ho et al. |
| 5,661,592 | A | 8/1997 | Bornstein et al. |
| 5,673,139 | A | 9/1997 | Johnson |
| 5,681,103 | A | 10/1997 | Remillard et al. |
| 5,757,562 | A | 5/1998 | Apollonov et al. |
| 5,867,302 | A | 2/1999 | Fleming |
| 5,903,078 | A | 5/1999 | Sakamoto et al. |
| 6,067,183 | A | 5/2000 | Furlani et al. |
| 6,133,570 | A | 10/2000 | Schimert et al. |
| 6,175,443 | B1 | 1/2001 | Aksuyk et al. |
| 6,233,088 | B1 * | 5/2001 | Roberson et al. ........... 359/291 |
| 6,396,620 | B1 | 5/2002 | Goodwin-Johansson |
| 2002/0148964 | A1 | 10/2002 | Dausch et al. |

FOREIGN PATENT DOCUMENTS

| | | |
|---|---|---|
| DE | 4235593 A | 10/1992 |
| EP | 0 834 759 A2 | 4/1998 |
| WO | WO 95/23352 A1 | 8/1995 |

OTHER PUBLICATIONS

M. Elwenspoet et al., "Active joints for microrobot limbs," *J Micromech. microeng,* 1992, pp. 221-223, IOP Publishing Ltd., United Kingdom.

V.P. Jaecklin et al. "Optical Microshutters and Torsional Micromirrors For Light Modulator Arrays," *IEEE,* 1993, pp. 124-127.

M. Elwenspoek et al. "Static and Dynamic Properties of Active Joints," *Transducers '95-Eurosensors IX, The $8^{th}$ International Conference on Solid-State Sensors and Actuators, and Eurosensors IX,* Jun. 25-29, 1995, pp. 412-415, Stockholm, Sweden.

Rob Legtenberg et al., "Electrostatic Curved Electrode Actuators," *IIEE,* 1995, pp. 37-42, Catalog No. 95CH35754.

Devi S Gunawan et al., "Micromachined corner cube reflectors as a communication link," *Sensors and Actuators,* 1995, pp. 580-583, Nos. 1/3, Lausanne, CH.

M. Edward Montamedi et al., "Development of micro-electro-mechanical optical scanner," *Optical. Engineering,* May 1997, pp. 1347-1352, vol. 36, No. 5.

J. Haji-Babaer et al. "Integrable Active Microvalve With Surface Micromachined Curled-Up Actuator," *IIEE,* 1997, pp. 833-836, 1997 International Conference o n Solid State Sensors and Actuators, Chicago, Jun. 16-19, 1997.

Behrang Behin, et al. "Magnetically Actuated Micromirrors for Fiber-Optic Switching," *Solid-State Sensors and Actuator Workshop* Jun. 8-11, 1998, pp. 273-276, Hilton Head Island, South Carolina.

K. Deng, et al. "The Development of Polysilicon Micromotors for Optical Scanning Applications," *Paper, Electronics Design Center, Department of Electrical Engineering and Applied Physics, Case Western Reserve University, Cleveland, Ohio,* 5 pages.

Hiroshi Goto et al. "Scanning Optical Sensor for Micro Robot,"*Paper, Central R&D Laboratory, OMRON Corporation,* 6 pages.

V.P. Jaecklin et al. "Mechanical and Optical Properties of Surface Micromachined Torsional Mirrors in Silicon, Polysilicon and Aluminum," *The $7^{th}$ International Conference on Solid-State Sensors and Actuators,* pp. 958-961.

* cited by examiner

ELECTROMAGNETIC RADIATION DETECTORS HAVING A MICROELECTROMECHANICAL SHUTTER DEVICE

CROSS-REFERENCES TO RELATED APPLICATIONS

This application is a continuation-in-part of U.S. patent application Ser. No. 09/834,825 filed on Apr. 13, 2001 now U.S. Pat. No. 6,586,738, which is hereby incorporated herein in its entirety by reference.

FIELD OF THE INVENTION

The present invention relates to electromagnetic radiation detectors, and more particularly to electromagnetic radiation detectors used in conjunction with microelectromechanical systems (MEMS) shutter devices.

BACKGROUND OF THE INVENTION

Advances in thin film technology have enabled the development of sophisticated integrated circuits. This advanced semiconductor technology has also been leveraged to create MEMS (Micro Electro Mechanical System) structures. MEMS structures are typically capable of motion or applying force. Many different varieties of MEMS devices have been created, including microsensors, microgears, micromotors, and other microengineered devices. MEMS devices are being developed for a wide variety of applications because they provide the advantages of low cost, high reliability and extremely small size.

Design freedom afforded to engineers of MEMS devices has led to the development of various techniques and structures for providing the force necessary to cause the desired motion within microstructures. For example, microcantilevers have been used to apply rotational mechanical force to rotate micromachined springs and gears. Electromagnetic fields have been used to drive micromotors. Piezoelectric forces have also been successfully been used to controllably move micromachined structures. Controlled thermal expansion of actuators or other MEMS components has been used to create forces for driving microdevices.

Various MEMS devices have been developed that implement electrostatic force to move structures. Traditional electrostatic devices were constructed from laminated films cut from plastic or mylar materials. A flexible electrode was attached to the film, and another electrode was affixed to a base structure. Electrically energizing the respective electrodes created an electrostatic force attracting the electrodes to each other or repelling them from each other. A representative example of these devices is found in U.S. Pat. No. 4,266,339, entitled "Method for Making Rolling Electrode for Electrostatic Device", issued on May 12, 1981, in the name of inventor Kalt. These type of devices work well for typical motive applications, but these devices cannot be constructed in dimensions suitable for miniaturized integrated circuits, biomedical applications, or MEMS structures.

Micromachined MEMS devices have also utilized electrostatic forces to move microstructures. Some MEMS electrostatic devices use relatively rigid cantilever members, as found in U.S. Pat. No. 5,578,976, entitled Micro Electromechanical RF Switch", issued on Nov. 26, 1996 in the name of inventor Yao. These types of cantilevered actuators fail to disclose flexible electrostatic actuators with a radius of curvature oriented away from the substrate surface. Other MEMS devices disclose curved electrostatic actuators; however, some of these devices incorporate complex geometries using relatively difficult microfabrication techniques.

Recent developments have led to simplified MEMS devices that utilize electrostatic forces to move structures. These devices, which are based on flexible membranes that embody electrodes, provide for ease in fabrication and can be processed using conventional MEMS fabrication techniques. See for example, U.S. Pat. No. 6,057,520, entitled "Arc Resistant High Voltage Micromachined Electrostatic Switch", issued on May 2, 2000, in the name of inventor Goodwin-Johansson. The Goodwin-Johansson '520 patent is herein incorporated by reference as if setforth fully herein. By modifying the biasing capabilities of the flexible film actuator disclosed in the Goodwin-Johansson '520 patent it is possible to fabricate actuators having a radius of curvature such that the actuator will fully curl prior to applying electrostatic voltage and fully uncurl upon the application of electrostatic voltage.

Current electromagnetic radiation imaging devices, typically infrared (IR) imaging devices, such as night vision devices, forward looking infrared devices (FLIRs) and the like, implement mechanical chopper wheels as the means by which radiation signals are pulsed for submission to the detectors/pixels. These chopping mechanisms are necessary for imaging device detectors to modulate or chop the incident electromagnetic radiation. The need for chopping of the signal is especially apparent in pyroelectric detectors since electrical charge is generated in the pyroelectric material by a change in temperature. The change in polarization of the pyroelectric material is defined in terms of the temperature change as:

$$\Delta P_i = p_i \Delta T$$

where $\Delta P_i$ is a change in polarization, $p_i$ is the pyroelectric coefficient and $\Delta T$ is the temperature change that the pyroelectric film detects corresponding to changes in the incident radiation.

Signal chopping is also beneficial for other electromagnetic radiation detector systems, preferably infrared detector systems, such as thermal bolometers that produce a change in resistance with temperature. The resistance change in a thermal bolometer is a direct current effect, versus the pyroelectric detector, which is an alternating current effect, so a shuttering or chopping device is not necessarily required for a bolometer detector. However, for systems needing high sensitivity or low noise, signal chopping is needed to periodically modulate the signal to prevent thermal drift and signal noise such that high sensitivities can be achieved.

Signal chopping is beneficial for cooled infrared detectors, such as photodetectors that detect photons in an optical signal, generate charge carriers in response to the photon energy and create a signal in the form of current or voltage. By comparison, photovoltaic detector materials generally create electron-hole pairs in the p-n junction formed in the material in response to photon energy, which creates a voltage signal. Photoconductive detector materials generally produce a change in electrical conductance in the material in response to the photon energy, which creates a current signal. Quantum well infrared photodetector materials (QWIP) generally produce electronics within the quantum well semiconductor layers producing a current signal in response to photon energy. Similar to thermal bolometers, photodetectors provide for direct current effects, so a chopper device is not necessarily required for a photodetector. However, for systems needing high sensitivity and/or low noise, a signal chopping device may be implemented.

While a chopping device provides for the signal to be "chopped" or blocked at a continuous frequency, generally in the range of 10 to 1000 Hz, a shutter device provides for the signal to be blocked at intermittent intervals to create "on" and "off" states. There is also a need to provide reliable, low-power, miniaturized shutters to create intermittent on/off states for electromagnetic radiation detector systems, preferably IR detectors. In military systems, there are often environmental conditions that can be hazardous to the detector or user if the detector is not turned off at the appropriate time. Such conditions may occur when the detector is directed toward the sun, a high power laser source, or other conditions, which would produce a high brightness of light or heat. The IR detector needs to be quickly shuttered off in these conditions. Conventional mechanical shutters are large in size, require high power to operate, and suffer from slow speed of operation. These devices are not easily integrated in battery-operated, miniaturized detector systems with low operating power requirements and minimal size and weight.

The typical mechanical shutters or chopper wheels that are currently used in such imaging devices tend to be bulky in size (e.g., 1 to 4 inch diameter wheels made of patterned germanium or machined metal), consume significant electrical power and are typically constructed separate from the associated detectors and pixels. In addition, chopper wheels are potentially unreliable and inefficient in modulating the electromagnetic radiation signals. These chopper wheels are limited to "chopping" the signal at a continuous frequency and do not provide the capability for intermittent operation. Mechanical shutters are limited in the speed at which they can provide an intermittent on/off signal (minimum cycle time >1 millisecond). Additionally, since the shutter or chopper wheel will typically be responsible for chopping an entire focal plane array of detectors/pixels, if the shutter or chopper wheel fails, the entire FPA of detectors is rendered inoperable.

A need exists to develop a chopping or shutter device for electromagnetic radiation signal detection that is simple in design and fabrication, consumes less space and electrical power in the detector system, and is more reliable and efficient than current devices. By incorporating MEMS technology, and more specifically electrostatically activated flexible film actuators as chopping or shuttering elements it is possible to design and fabricate a unitary structure that allows for further reduction in detector/pixel size as advances in the field of IR imaging devices occur. The electrostatic activation of such a device would provide significant size reduction and consume much less power compared with the typical chopping wheel and associated drive motor. Power consumed by the electrostatically activated MEMS chopper is about 2 mW at 100 Hz compared with a chopper wheel motor which consumes several Watts of power.

Additionally, such a device would provide for individual shuttering elements (i.e., actuators) to be associated with an individual detector/pixel or, alternatively, a parsed portion of the overall FPA. This would allow the IR FPA to remain operational if only a single chopper or shutter element was to fail. In the same regard, it would be possible to close off individual detectors/pixels or small subsets of detectors/pixels could be closed while the remainder of detectors/pixels remain open. In this instance, the closed pixels could then be referenced as the background temperature to subtract out possible noise or temperature fluctuations occurring in the FPA. As such this would provide for a means of noise reduction and compensation for temperature fluctuations in the radiation detector. Current mechanical shutter or chopper wheel mechanisms are incapable of providing such noise reduction and/or temperature fluctuation compensation. In a similar fashion, if temperature spikes in the array result in "hot spots" (i.e. an area of constant brightness) this area could be closed independent of the remaining detector/pixels to reduce the signal resulting from the temperature spike to background levels. Localized detectivity could also be controlled by operating subsections of the FPA at a different chopping frequency. Lower chopping frequency could be used for areas of the image requiring higher sensitivity, and higher frequency could be used for faster image scan rates for less sensitive areas. Specific detectivity of IR detectors is known to be dependent on chopping frequency.

Moreover, such a device would allow for the duty cycle of the shutter/chopper to be altered to increase the detector output. A device that is capable of insitu duty cycle variance allows for an increase in the resistance, voltage or current signal produced by the detector by increasing the time per cycle that detector elements are exposed to the incident radiation. With conventional chopping wheel mechanisms the duty cycle can only be varied by replacing the wheel with one that exhibits the requisite duty cycle characteristics. An intermittent on/off shutter device can also be provided with much faster on/off cycle times (<100 microseconds).

As such a need exists to develop an improved electromagnetic radiation shutter/chopper device, specifically an electrostatically activated MEMS device that will leverage the simplified MEMS fabrication techniques with the advantages of individual actuator design. Such a design will additionally provide signal noise reduction, signal gain, faster speed, sensitivity and duty cycle modulation, compensation for temperature fluctuations and background referencing capabilities.

SUMMARY OF THE INVENTION

The present invention provides for an improved electromagnetic radiation detector having an electrostatic shuttering device and associated arrays incorporating a plurality of detectors and/or shuttering devices. An electrostatically activated MEMS shuttering device is provided that provides reliability, efficiency, and noise reduction capabilities to the associated electromagnetic radiation detectors.

An electromagnetic radiation detector having an electrostatic MEMS shuttering device according to the present invention comprises a photo-detector material element, typically a photovoltaic or photoconductive material element and a flexible film actuator overlying the photo-detector material layer and moveable relative thereto. The flexible film actuator will typically include an electrode element and a biasing element such that the actuator remains in a fully curled, open state absent electrostatic voltage and moves to a fully uncurled, closed state upon the application of electrostatic voltage. Typically, the detector will incorporate a transparent substrate disposed between the flexible film actuator and the photo-detector element.

In one embodiment of the invention the flexible film actuator is fabricated directly on the photo-detector or the pixels of a focal plane array having a fixed portion of the actuator attached to the underlying surface and a distal portion that is released from the underlying surface. The electrode element in the flexible film actuator and an underlying fixed transparent electrode interact to provide the electrostatic voltage necessary to move the flexible film actuator.

In an alternate embodiment, an electromagnetic radiation detector device having an electrostatically driven MEMS shutter is defined by a first transparent substrate having a flexible film actuator disposed on the first transparent substrate. In addition, the device includes a second transparent substrate and a photo-detector element disposed on the second transparent substrate. The photo-detector will typically comprise a photovoltaic or photoconductive element. A means, such as solder bumps, adhesives or the like, is provided for connecting the first transparent substrate to the second transparent substrate.

Alternatively, the invention is embodied in an array of detectors having associated electrostatically activated shutter devices. The array includes a plurality of detector pixels, each detector pixel comprising a photo-detector material layer. In addition, the array includes a plurality of flexible film actuators, each actuator generally overlying the detector material layer of a corresponding detector pixel and moveable relative thereto to alternately allow passage of radiation to the photo-detector material layer and block passage of radiation to the photo-detector material.

A method for pixel modulation in an electromagnetic detector array is also provided for. The method comprises providing for a plurality of electrostatically activated flexible film actuators, each actuator corresponding to one or more photo-detector pixels in an electromagnetic radiation array. Shuttering one or more flexible film actuators to allow passage of electromagnetic radiation to the one or more photo-detector pixels corresponding to the flexible film actuator. In turn, the shuttering of the actuators causes the photo-detectors to detect photons, which generates charge carriers in the material. The electrons correspond to a voltage or current signal, which in turn is communicated to a read-out circuit.

As such the present invention provides for an improved electromagnetic radiation shutter/chopper device, specifically an electrostatically activated MEMS device that will leverage the simplified MEMS fabrication techniques with the advantages of individual actuator design. Such a design will additionally provide signal noise reduction and sensitivity modulation capabilities.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
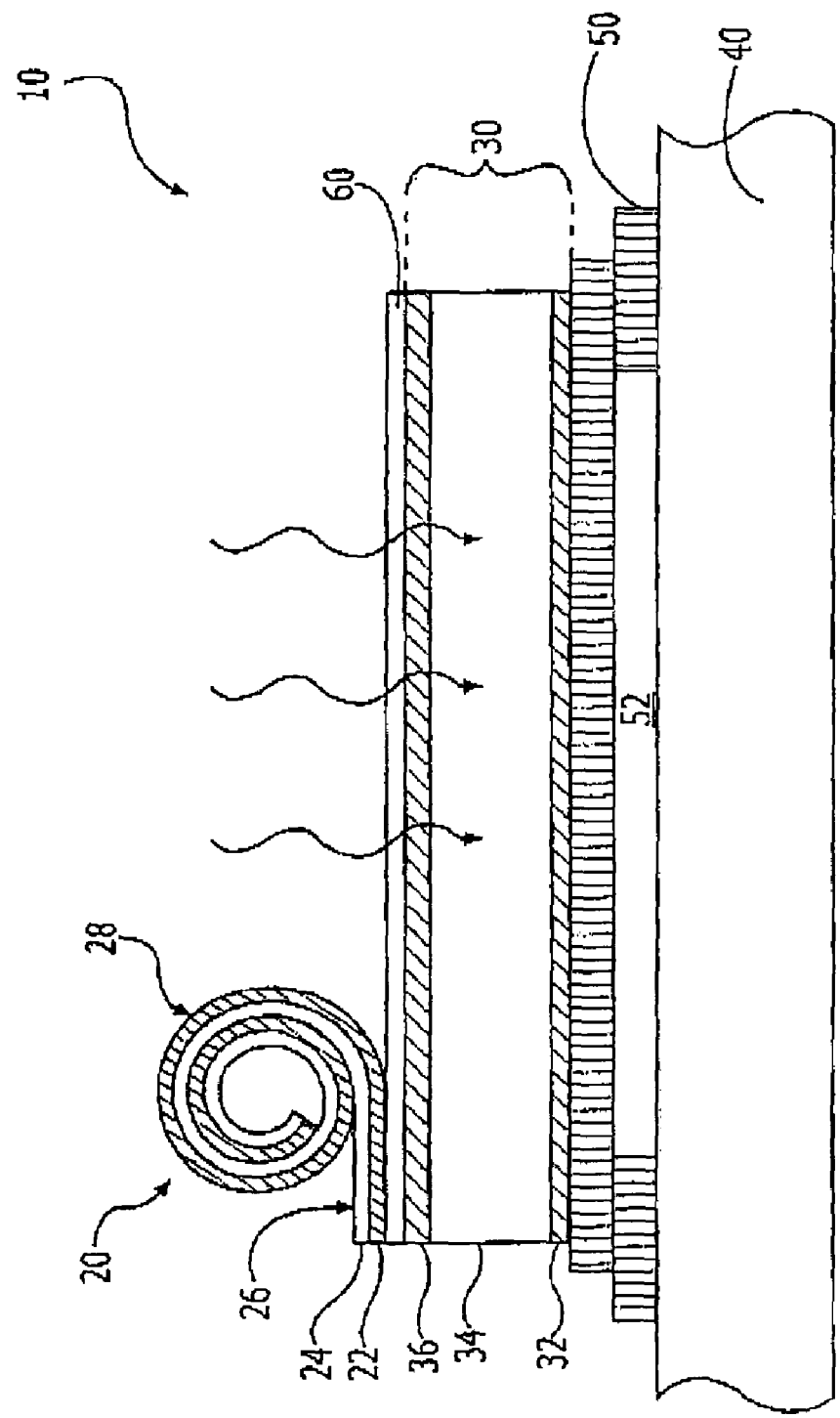
FIG. 1 is a cross-sectional view of an electromagnetic radiation thermal detector having an electrostatically driven MEMS chopper/shutter device in the open state, in accordance with an embodiment of the present invention.
Figure 2:
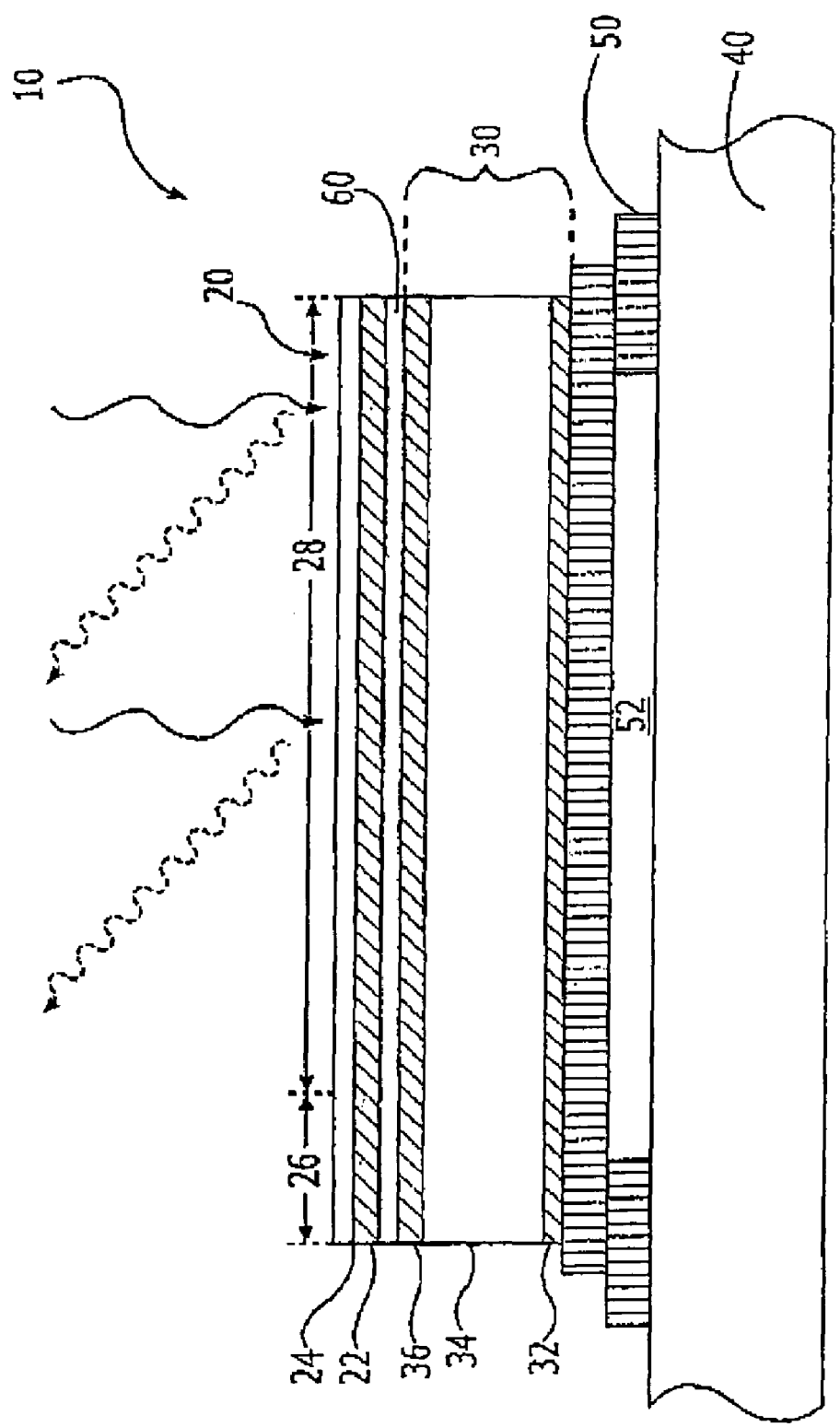
FIG. 2 is a cross-sectional view of an electromagnetic radiation thermal detector having an electrostatically driven MEMS chopper/shutter device in the closed state, in accordance with an embodiment of the present invention.

Referring to FIGS. 1 and 2, in accordance with one embodiment of the invention a thermal electromagnetic radiation detector having an electrostatically driven MEMS radiation chopper/shutter device 10 is depicted in cross-section in open and closed states. Reference to the device as either a chopper device or a shutter device is determined by the mode of operation and therefore the terms are used interchangeably throughout the detailed description of the invention. As a chopper device the flexible film actuator is pulsed at continuous frequency to allow for the radiation signal to be "chopped" at a specified frequency, generally in the range of about 10 to 1000 Hz. As a shutter device the flexible film actuator is intermittently operated to allow for the radiation signal to be blocked in the "closed" actuator state and allow for the signal to be detected in the "opened" actuator state.

In this embodiment the flexible film actuator 20 is fabricated directly on the detector 30. It will be understood by those having ordinary skill in the art that when a layer or element is described herein as being "on" another layer or element, it may be formed directly on the layer, at the top, bottom or side surface area, or one or more intervening layers may be provided between the layers.

In FIG. 1, the chopper/shutter device is shown in the open state, in which the flexible film actuator 20 is depicted in a curled position (i.e. open state) that allows electromagnetic radiation, typically infrared radiation, to pass through to the detector 30. In FIG. 2, the shutter/chopper device is shown in a closed state, in which the flexible film actuator 20 is depicted in an uncurled position (i.e. closed state) that blocks radiation from passing through to the detector 30. The chopper/shutter device moves from the open to closed states or is pulsed (i.e., rapidly moved from the open to closed states) by applying an electrostatic force between an electrode in the flexible film actuator and an associated fixed electrode that underlies the flexible film actuator. Typically, in the absence of electrostatic force the flexible film actuator will be positioned in the open state and application of electrostatic force will result in the flexible film be positioned in the closed state.

In accordance with the present invention, the electromagnetic radiation detector having an electrostatically driven MEMS radiation chopper/shutter device 10 will comprise a detector device 30 that will be sensitive to electromagnetic radiation exposure. The detector device may include a pyroelectric detector, a thermal microbolometer, a dielectric microbolometer, or any other detector or sensing device that is sensitive to electromagnetic radiation exposure. In the embodiment shown in FIGS. 1 and 2, the detector comprises a first electrode element 32, a detector material element 34, and a second electrode element 36. The first and second electrode elements will be in electrical contact with the detector element and will be electrically isolated from one another. As shown, the detector material element is formed as a layer that is positioned between the first and second electrode elements that are also formed as layers, however; it is also possible, and within the inventive concepts herein disclosed, to configure the detector element and electrode elements in other suitable arrangements that facilitate electrode contact with the detector element and electrical isolation amongst the electrodes. The first and second electrode elements may comprise gold, platinum, titanium, chromium, ruthenium oxide ($RuO_2$), lanthanum strontium cobalt oxide (LSCO) or other electrically conducting material.

The detector device 30 will typically be supported by a substrate 40, preferably a microelectronic substrate, such as a silicon substrate embodying a CMOS-type (Complementary Metal-Oxide Silicon) read-out circuit. It should be noted that while most embodiments of the invention will include a substrate that supports the detector device it is also possible, and within the inventive concepts herein disclosed to have the detector device free-standing and/or remote from an underlying or supporting substrate.

Additionally, the electromagnetic detector having an electrostatically driven MEMS radiation chopper/shutter device will comprise a flexible film actuator 20. The flexible film actuator will typically include an electrode element and at least one biasing element. In the embodiment shown in FIG. 1 and 2, the flexible film actuator comprises an electrode layer 22 and a biasing layer 24. In alternate embodiments of the invention, the flexible film actuator may include other combinations of biasing layers and electrode layers, such as an electrode layer positioned between two biasing layers. The flexible film actuator will typically have a fixed portion 26 that is attached to the underlying surface and a distal portion 28 that is released from the underlying surface during fabrication and is moveable with respect to an underlying electrode. In the embodiment shown the distal portion is represented by the curled portion of the flexible film. The curl in the film is typically imparted during fabrication and is generally induced by thermal or mechanical stresses imparted during processing. The flexible film actuator will be positioned such that it generally overlies the entirety of the detector element when the actuator is positioned in the closed state.

Actuator motion is produced by an applied electrostatic field between the electrode in the distal portion of the flexible film actuator and a fixed electrode in the underlying construct. In the embodiment shown in FIGS. 1 and 2, in which the flexible film actuator is fabricated directly on top of the detectors the fixed electrode used for electrostatic actuation may be the second electrode element 36 of the detector 30 or, alternatively, a separate fixed electrode may be formed in the construct as a distinct layer. If a separate fixed electrode layer is formed in the construct it will typically be electrically isolated from the electrode elements of the detector by some form of insulation, typically a dielectric insulation layer disposed between the fixed electrode and the electrode element of the detector. In addition, if a separate fixed electrode is formed it must also be transparent to the electromagnetic radiation being detected. The transparent electrode may include a conducting oxide material, such as lanthanum strontium cobalt oxide (LSCO) or nickel cobalt oxide ($NiCo_2O_4$).

Additionally, the electromagnetic radiation detector having an electrostatically driven MEMS radiation chopper/shutter device will be fabricated on a radiation detector that typically will include a thermal isolation bridge 50 that serves to alleviate thermal effects migrating from the detector 30 to the circuitry in the substrate 40. The thermal isolation bridge will typically be formed so as to provide for an air gap 52 between the detector and the substrate. Standard MEMS fabrication techniques, typically employing release layer processing, are used to form the thermal isolation bridge and the resulting air gap. An exemplary thermal isolation bridge will have a thickness of about 1000 to about 5000 angstroms and be formed of a suitable nitride, such as silicon nitride or the like.

The electromagnetic radiation detector having an electrostatically driven MEMS radiation chopper/shutter device may also include a radiation absorbing layer 60 that provides radiation-absorbing capabilities to facilitate the passage of radiation to the detector element as thermal energy. In the embodiment shown in FIGS. 1 and 2, the radiation-absorbing layer 60 is formed as a layer disposed on the second electrode element 36. In a typical embodiment the absorbing layer will have a thickness of about 1.0 to about 2.0 micrometers and may comprise a black or absorbing polymer material, carbon black, nickel alloy or gold black.

The detector 30 of the present invention may embody any detector or sensing device that is sensitive to electromagnetic radiation. For instance, the detector may be embodied in an uncooled infrared detector, such as a pyroelectric detector or a thermal microbolometer or the like. In typical uncooled embodiments the detector will be sensitive to long wave infrared (IR) radiation that characteristically exists in the about 8 to about 12 micrometer wavelength range.

In a pyroelectric detector the detecting material layer 34 will comprise a ferroelectric material, such as lead zirconate titanate (PZT), lithium tantalate ($LiTaO_3$), lanthanum doped lead titanium oxide ($PbTiO_3$), barium strontium titanate (BST), polyvinylidenefluoride (PVDF) or the like. In a pyroelectric detector the flexible film actuator is pulsed (i.e., rapidly changed from open and closed states) to generate a temperature change in the ferroelectric material. As is known by those with ordinary skill in the art, a pyroelectric detector functions as a ferroelectric capacitor with the capacitor dielectric being spontaneously polarized when the temperature is below the Curie temperature. Since the degree of polarization in pyroelectric material changes with temperature below the Curie point, the voltage across the capacitor changes as the temperature changes. This change in voltage provides a pyroelectric read-out current to circuitry typically located on the substrate 40.

In a thermal microbolometer the detecting material layer 34 will comprise a metal oxide that is used as a resistor. The metal oxide will characteristically have a high rate of change of resistance with temperature. For example, the detecting material layer 34 may comprise vanadium oxide ($VO_x$) where subscript x may be equal to 2 or represent some other stoichiometry) or a similar metal oxide or semiconductor. While these types of detectors do not typically employ the use of a radiation chopping mechanisms the implementation of the chopping device of the present invention may provide a reduction in thermal drift, a decrease in signal noise and an increase in sensitivity of the detector.

As previously discussed, the flexible film actuator 20 will generally comprise multiple layers including at least one electrode layer 22 and one or more biasing layers 24. The number of layers, thickness of layers, arrangement of layers, and choice of materials used may be selected to affect the degree of curl in the flexible film composite. In the preferred embodiment the flexible film actuator will be curled to the greatest degree possible so as to maximize the exposed region of the underlying detector when the actuator is in an open state. The layers are arranged and shown vertically, while the fixed and distal portions are disposed horizontally along the flexible film actuator. The distal portion (i.e., the curled portion) of the flexible film actuator is released from the underlying surface by employing conventional release layer processing during fabrication.

The electrode layer 22 of the flexible film actuator will comprise a flexible conductor material, such as gold, although other acid tolerant (for release layer processing purposes) conductors such as conductive polymer film may be used. The electrode element also serves to deflect the electromagnetic radiation when the actuator is uncurled or closed. While the plan view configuration of the overall flexible film actuator will generally mirror the plan view configuration of the underlying detector, the surface area or configuration of the electrode layer 22 can be varied as required to create the desired electrostatic force or varied as a function of the distance from the fixed portion.

It should be noted that in applications in which the flexible electrode layer 24 or the first and second electrode layers 32 and 36 of the detector are formed of gold it may be necessary to deposit a thin layer of chromium onto the flexible electrode layer or the first and second electrode layers to promote adhesion for the subsequently formed layer(s).

The biasing element will typically comprise polyimide, although other flexible polymers suitable for release layer processing may also be used to form the biasing layer. As shown in FIGS. 1 and 2, the minimal configuration of the flexible film actuator will include two layers; one layer biasing layer 24, and one layer of flexible electrode 26. Alternatively embodiments may include additional biasing elements/layers and or additional electrode elements/layers. One such embodiment will include an electrode layer deposited between two biasing layers (i.e., biasing layer/electrode layer/biasing layer).

Different thermal coefficients of expansion between the biasing layer and the electrode layer will bias the distal portion 28 of the actuator to curl away from the underlying surface after removal of the release layer. Additionally, other techniques may be used to curl the flexible film actuator. For example, different deposition process steps can be used to create intrinsic stresses so as to curl the layers comprising the flexible film actuator. Further, the flexible film can be curled by creating intrinsic mechanical stresses in the layers included therein. In addition, sequential temperature changes during processing can be used to curl the flexible film. For instance, the polymeric biasing film can be deposited as a liquid and then cured at elevated temperatures so that it forms a solid polymer layer. Preferably, a polymer having a higher thermal coefficient of expansion than the electrode layer can be used. Next, the polymer layer and electrode layer are cooled, creating stresses due to differences in the thermal coefficients of expansion. The overall flexible film curls because the polymeric biasing layer shrinks faster than the electrode layer.

Figure 3:
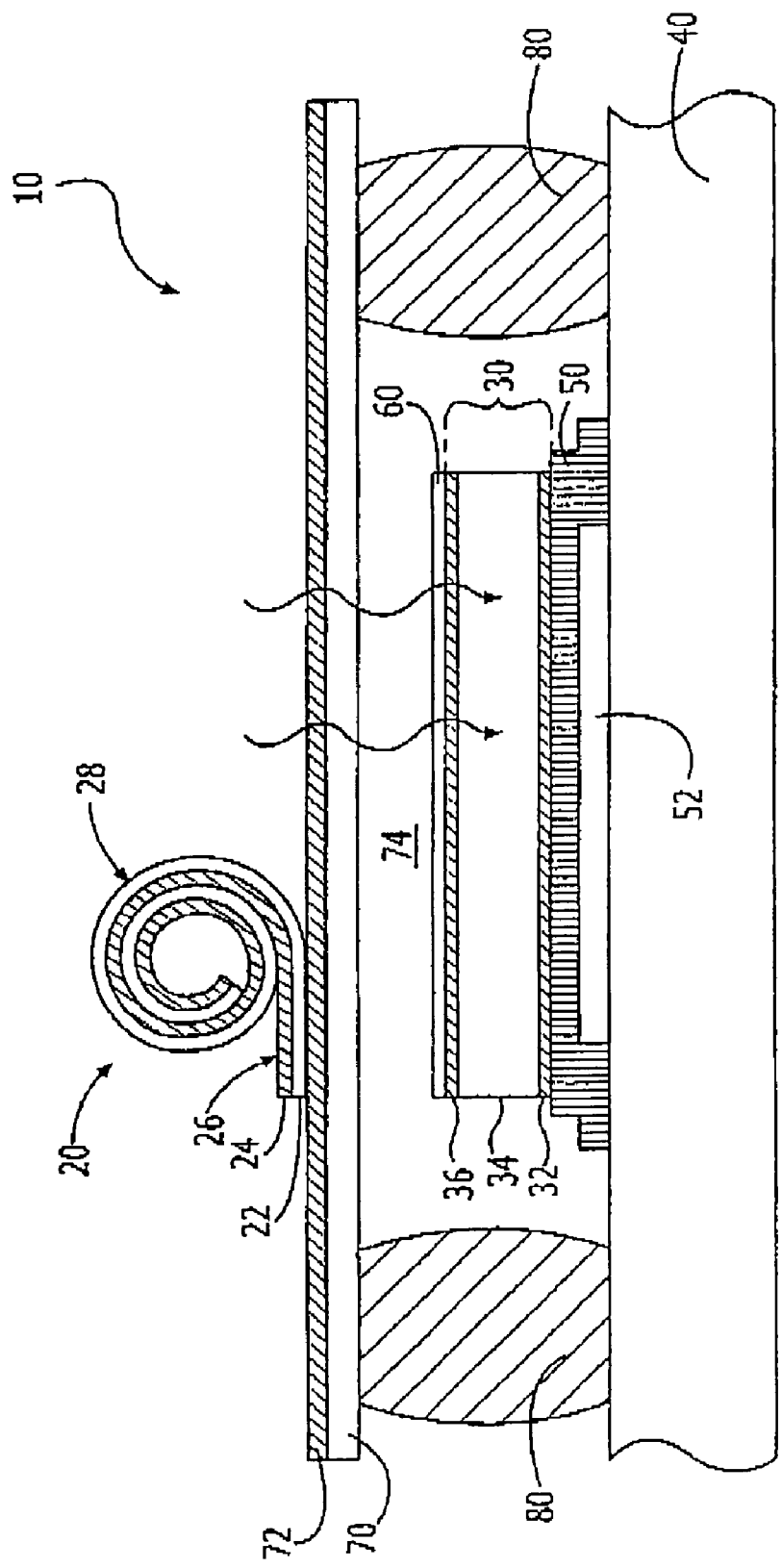
FIG. 3 is a cross-sectional view of an electromagnetic radiation thermal detector having an electrostatically driven MEMS chopper/shutter device in the closed state having the flexible film actuator formed on a second substrate, in accordance with an alternate embodiment of the present invention.
Figure 4:
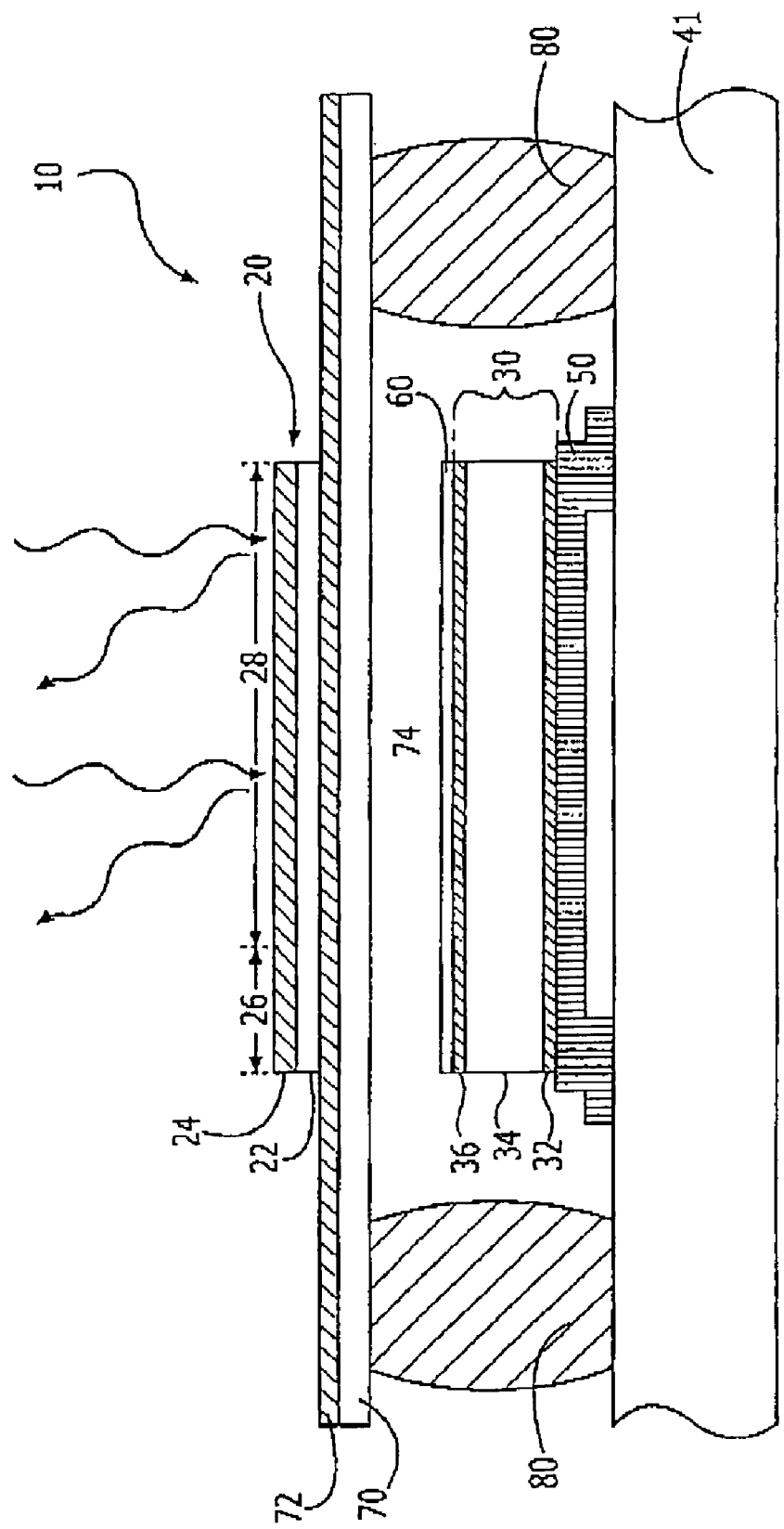
FIG. 4 is a cross-sectional view of an electromagnetic radiation thermal detector having an electrostatically driven MEMS chopper/shutter device in the open state having the flexible film actuator formed on a second substrate, in accordance with an alternate embodiment of the present invention.

FIGS. 3 and 4, illustrate cross-sectional views of an alternate embodiment of the present invention. In this embodiment of the electromagnetic radiation detector having an electrostatically driven MEMS chopper/shutter device 10, the flexible film actuator 20 is supported by and attached to a second substrate 70 that is generally raised in relation to the underlying detector device. FIG. 3 illustrates the flexible film actuator in the open state in which radiation is allowed to pass and be absorbed into the underlying detector. Alternately, FIG. 4 illustrates the flexible film actuator in the closed state in which incoming radiation is reflected off the surface of extended surface of the actuator. The second substrate is typically formed of a material that is transparent to the electromagnetic radiation that is being detected. In applications in which IR radiation is being detected the second substrate may comprise germanium (Ge), zinc sulfide (ZnS), zinc selenide (ZnSe) or a similar IR transparent substrate material. The second substrate will have a fixed transparent electrode element 72 disposed thereon to provide, in conjunction with the electrode element of the flexible film, electrostatic voltage to the flexible film actuator. In applications in which IR radiation is being detected the transparent electrode may comprise a conductive oxide material, such as lanthanum strontium cobalt oxide (LSCO), nickel cobalt oxide ($NiCo_2O_4$) or the like.

By providing for an additional second substrate that has the flexible film actuator disposed thereon, signal interference between the actuator drive voltage and the detector output signal is significantly reduced. This signal interference reduction is attributed to the insulating characteristics of the second substrate 70 and the air gap 74 that is provided for between the second substrate and the detector 30. In a typical chopper/shutter device embodying a second substrate the air gap between the second substrate and the detector will be on the order of about 10 to about 1000 micrometers.

The second substrate 70 is supported by the underlying substrate 40 via support structures 80. Additionally, the support structures serve to elevate the second substrate and associated flexible film actuator above the detector device 30. In a typical embodiment, the support structures may be formed from solder bumps, epoxy structures or any other suitable structure capable of supporting the second substrate.

Figure 5:
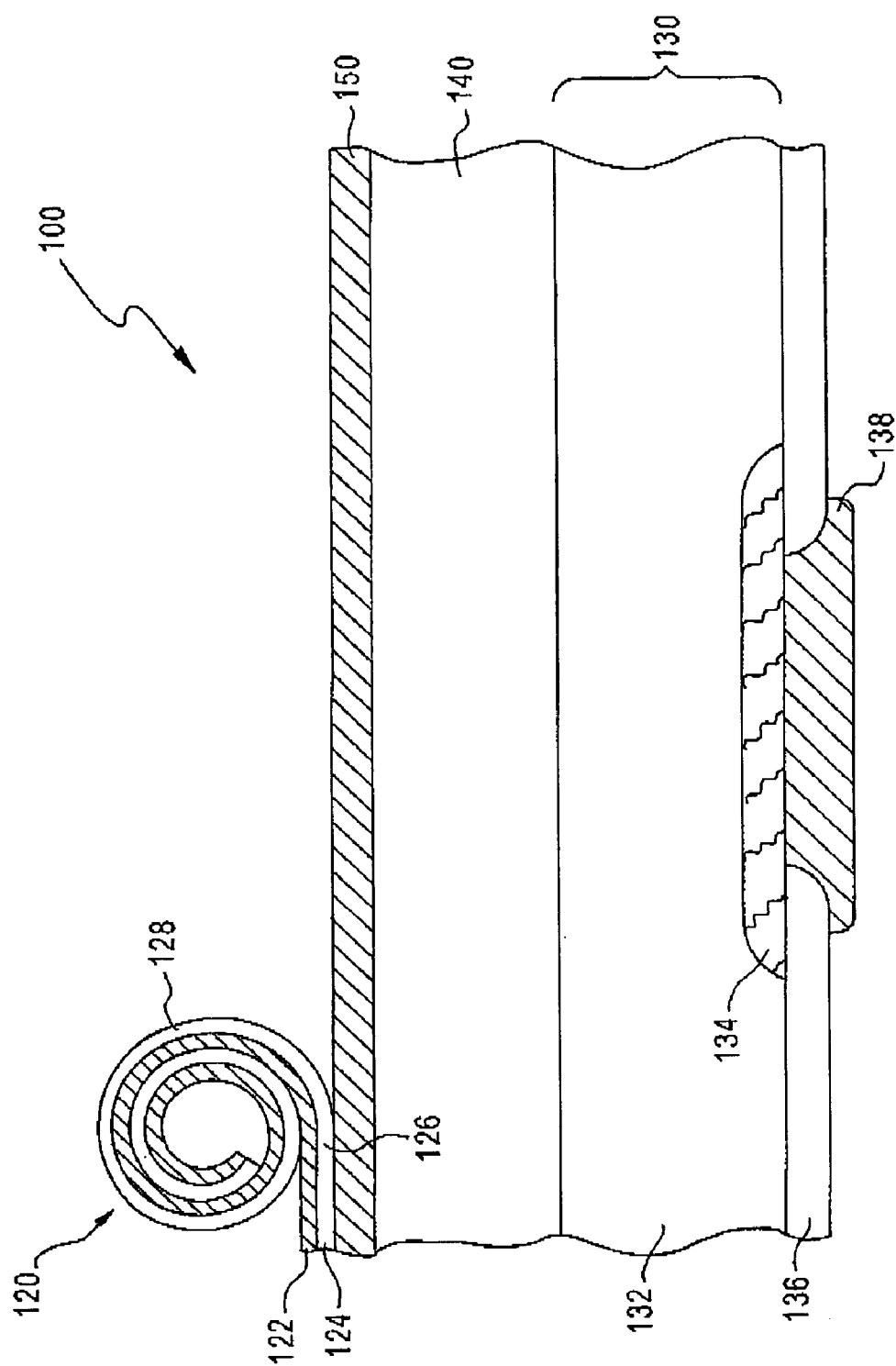
FIG. 5 is a cross-sectional view of an electromagnetic radiation photo-detector having an electrostatically driven MEMS chopper/shutter device in the open state, in accordance with an embodiment of the present invention.
Figure 6:
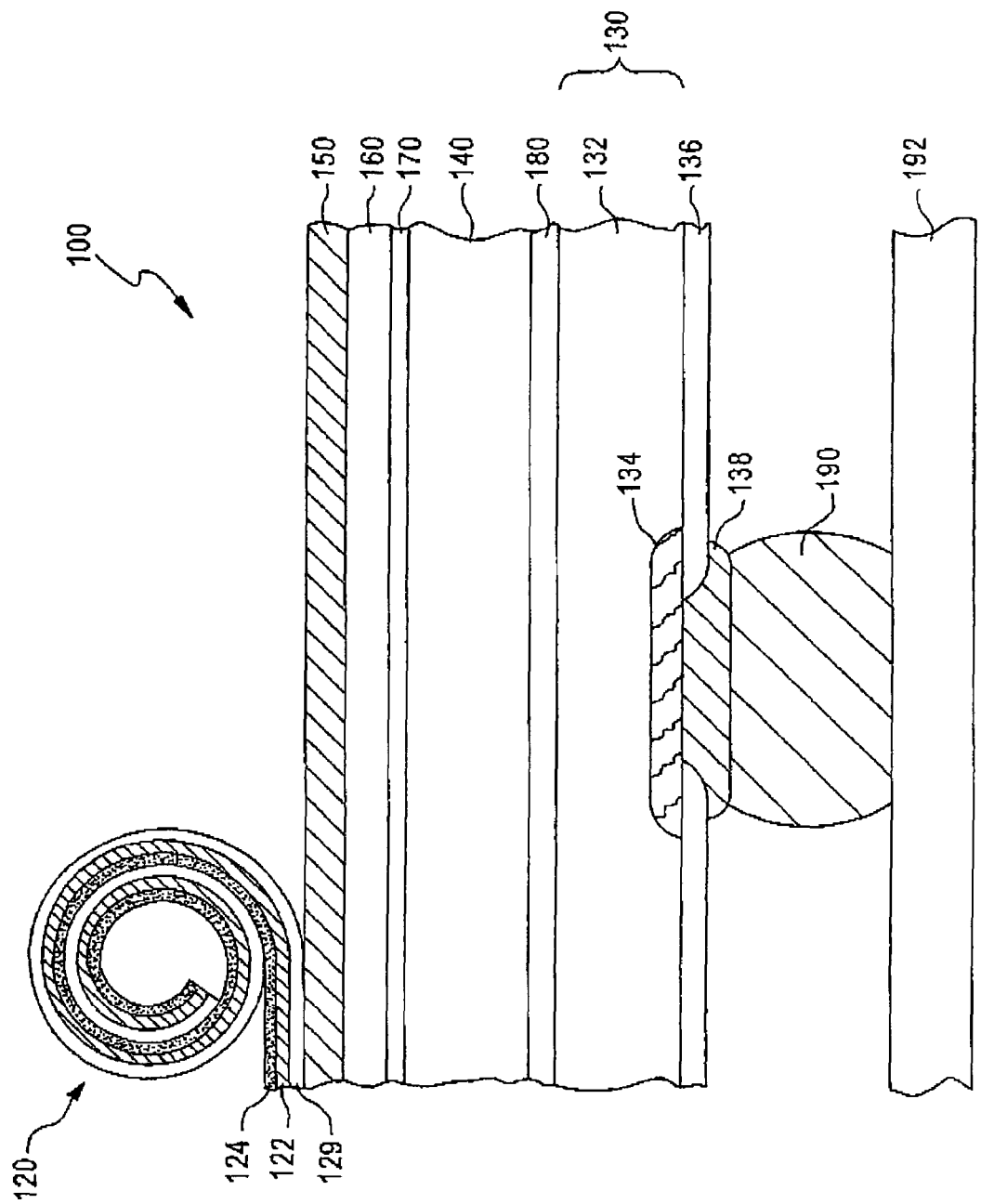
FIG. 6 is a cross-sectional view of an electromagnetic radiation photo-detector having an electrostatically driven MEMS chopper/shutter device in the open state and having optional layers, structures and circuitry, in accordance with an embodiment of the present invention.
Figure 7:
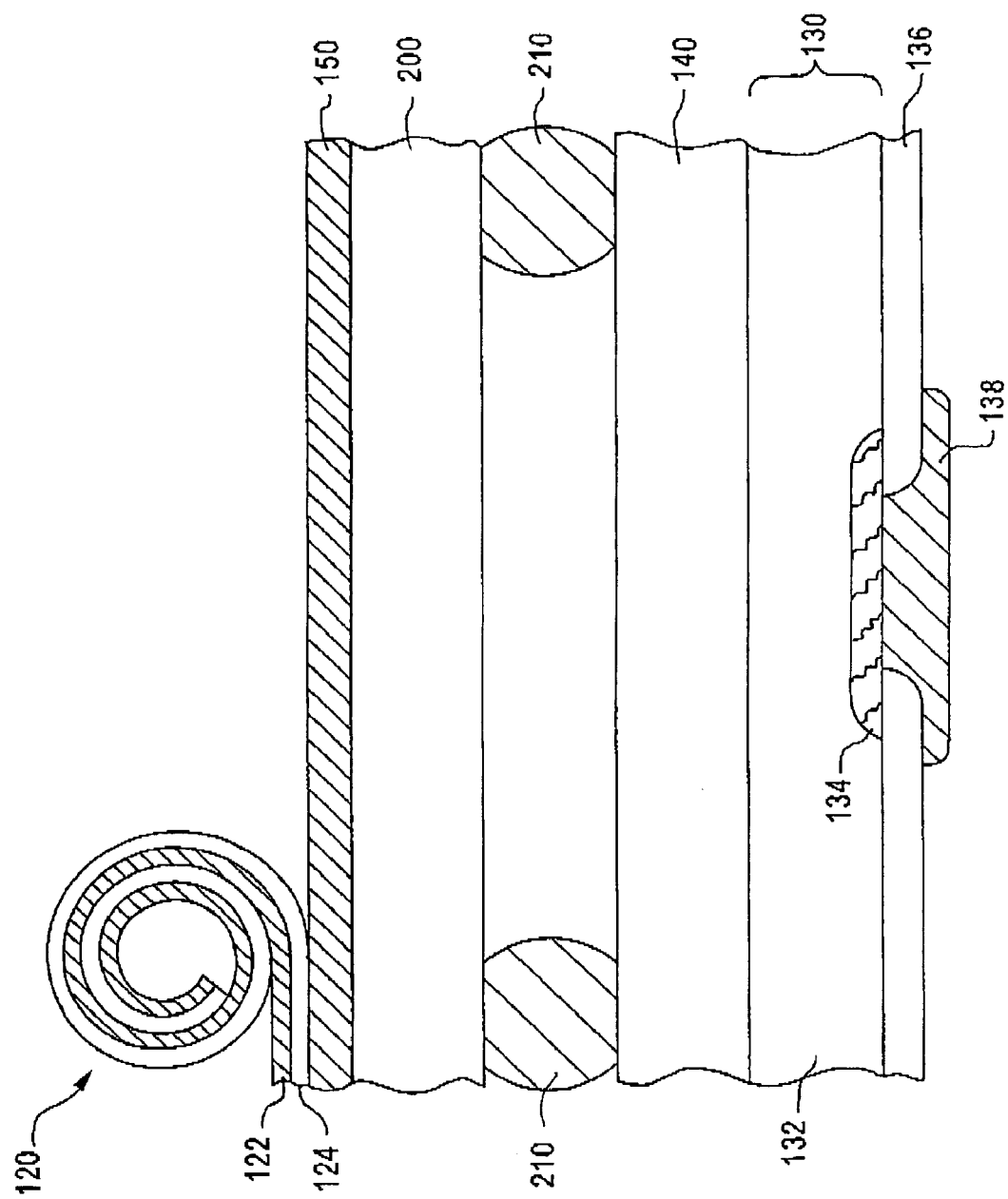
FIG. 7 is a cross-sectional view of an electromagnetic radiation photo-detector having an electrostatically driven MEMS chopper/shutter device in the open state having solder bumps that are used to connect the flexible film actuator construct to the photo-detector construct, in accordance with an embodiment of the present invention.

FIGS. 5, 6 and 7 illustrate cross-sectional figures of alternative embodiments of the MEMS chopper/shutter device 100 of the present invention in which the electromagnetic radiation detector is characteristically defined as a photodetector. In FIG. 4, the chopper/shutter device is shown in the open state, in which the flexible film actuator 120 is depicted in a curled position (i.e. open state) that allows electromagnetic radiation, typically infrared radiation, to pass through to the detector element 130. The detector element may include a photovoltaic detector, a photoconductive detector or any other cooled detector or sensing device that is sensitive to electromagnetic radiation exposure. In the embodiment shown in FIGS. 5, 6 and 7, the detector comprises a semiconductor material 132 and a doped semiconductor region 134. Either the doped semiconductor region or the undoped semiconductor material is defined as a p-type region, while the other region is defined as an n-region to allow for the requisite p-n junction to be formed. As shown, the semiconductor material element is formed as a layer with doped semiconductor region being formed on the side of the semiconductor material layer that is positioned opposite of the flexible film actuator 120.

The semiconductor material may include silicon, germanium, mercury-cadmium-tellurium (HgCdTe), gallium arsenide (GaAs), indium antimonide (InSb), other III–V or II–VI compound semiconductors, or the like. These detectors can be used to sense short wave (1–2 micrometer wavelength range), mid wave (3–5 micrometer wavelength range) and long wave (8–14 micrometer wavelength range) IR radiation.

A passivation layer 136 is typically formed on the semiconductor material 132 and doped semiconductor region 134 to isolate electrical signals between detector elements on the same substrate and also provide more efficient recombination of charge carriers in the pn-junction regions. The passivation layer may comprise zinc sulfide, silicon nitride or any other suitable passivation material may be used. Once the passivation layer is formed the portion underlying the doped semiconductor region 134 is removed to allow for a metal contact 138 to be formed adjacent to the doped semiconductor region. The metal contact allows for the passage of the detected signal to associated read-out circuitry.

A transparent semiconductor substrate 140 will typically support the flexible film actuator 120 and will typically be located such that the radiation signal passes through the transparent semiconductor substrate before being detected by the detector element 130. The transparent semiconductor substrate may be formed of germanium (Ge), zinc sulfide (ZnS), zinc selenide (ZnSe) or a similar IR transparent substrate material. A transparent fixed electrode 150 is disposed on the transparent semiconductor substrate 140. The transparent fixed electrode may be formed of a conducting oxide material, such as indium tin oxide (ITO), lanthanum strontium cobalt oxide (LSCO) or nickel cobalt oxide ($NiCo_2O_4$).

The flexible film actuator 120 will typically include a flexible electrode element and at least one biasing element. In the embodiment shown in FIG. 5, the flexible film actuator comprises a flexible electrode layer 122 and a biasing layer 124. In alternate embodiments of the invention, the flexible film actuator may include other combinations of biasing layers and electrode layers, such as an electrode layer positioned between two biasing layers. The flexible film actuator will typically have a fixed portion 126 that is attached to the underlying surface and a distal portion 128 that is released from the underlying surface during fabrication and is moveable with respect to an underlying electrode. The flexible film actuator will be positioned such that it generally overlies the entirety of the detector element when the actuator is positioned in the closed state. Actuator motion is produced by an applied electrostatic field between the flexible electrode layer 122 and the fixed transparent electrode 150. In the embodiment shown in FIG. 5, the biasing layer serves as the necessary dielectric material to provide electrical isolation between the fixed transparent electrode and the flexible electrode layer in the flexible film actuator.

The embodiment in FIG. 6 illustrates a cross-sectional illustration of an electromagnetic radiation photodetector 100. The FIG. 6 embodiment differs from the FIG. 5 embodiment in that it incorporates optional layers, structures and circuitry that may typically be implemented in conjunction with the radiation photodetector shown in FIG. 5.

The flexible film actuator 120 includes an optional flexible dielectric layer 129 that serves to electrically isolate the flexible electrode layer from the fixed transparent electrode layer 150. The flexible dielectric layer may not be required in those embodiments in which the biasing layer is positioned between the flexible electrode layer and the fixed transparent layer and provides adequate dielectric capabilities. The flexible dielectric layer will typically comprise polyimide, a suitable oxide material or the like.

An optional fixed transparent dielectric material layer 160 may be positioned between the fixed transparent electrode 150 and the transparent semiconductor substrate 140. The optional transparent dielectric material layer provides electrical isolation between the fixed transparent electrode and the transparent semiconductor substrate in those embodiments that warrant such isolation. The fixed transparent may comprise polyimide, silicon oxide, aluminum oxide or the like.

An optional anti-reflection coating 170 may be disposed between the fixed transparent electrode 150 and the detector element 130. In the embodiment shown in FIG. 6, the anti-reflection coating is disposed as a layer between the transparent semiconductor substrate 140 and the optional fixed transparent dielectric layer 160. The anti-reflection coating serves to promote the transmission of the radiation through the device so as to allow for the radiation to contact the detector element 130. The anti-reflective coating may comprise magnesium fluoride (MgF) or any other suitable anti-reflective material.

An optional buffer layer 180 may be disposed adjacent to the detector element 130. The buffer layer is positioned on the semiconductor material layer 132 such that incident radiation passes through the buffer layer prior to be detected by the detector element 130. The buffer layer serves to improve the crystalline properties of the semiconductor material 132 deposited on the semiconductor substrate 140. The material used to form the buffer layer will be dependent upon the underlying semiconductor material. For example, in the embodiment in which the semiconductor material is formed of mercury-cadmium-tellurium (HgCdTe), the buffer layer may be formed of cadmium tellurium (CdTe).

An optional solder bump 190 and read-out integrated circuit 192 are depicted in FIG. 6. The solder bump is formed on the metal contact 138 and provides electrical connectivity between the detector and the associated read-out circuitry. The read-out circuitry may comprise s a silicon substrate embodying a CMOS-type (Complementary Metal-Oxide Silicon) read-out circuit. In the embodiment shown in FIG. 6, the read-out circuitry 192 is depicted to be proximate to the detector, however, it is also possible, and within the inventive concepts herein disclosed, to have the detector device free-standing and/or remote from an underlying or supporting substrate. In this case, the solder bump 192 may be replaced with an epoxy bond, wire bond or other means for providing electrical connectivity.

In fabricating the embodiments shown in FIGS. 5 and 6 the detector 130 is typically formed on the transparent semiconductor substrate 140 and then the fixed transparent electrode 150 and the flexible film actuator 120 are formed on the opposite side of the transparent semiconductor substrate. Conventional deposition techniques that are well known in the semiconductor industry are used to dispose the layers of the radiation photodetector shown in FIGS. 5 and 6. Release layer processing is typically employed to allow for the release from the semiconductor substrate construct of the distal portion of the flexible film actuator.

FIG. 7 illustrates a cross-sectional depiction of an alternative embodiment of the MEMS chopper/shutter photodetector device 100. The FIG. 7 embodiment differs from the FIG. 5 and 6 embodiments by the means in which the flexible film actuator construct is affixed to the underlying photodetector construct. In most instances, the embodiment shown in FIG. 7 provides for added ease in manufacturing the photodetector device.

The flexible film actuator 120 is disposed on a first transparent substrate 200. The transparent substrate may comprise quartz, sapphire, germanium, zinc sulfide or other suitable material transparent to the IR radiation to be detected. A fixed transparent electrode 150 is positioned between the first transparent electrode and the flexible film actuator and imparts electrostatic motion to the actuator when a voltage difference is applied across the fixed transparent electrode and the flexible electrode 122 of the flexible film actuator 120. As depicted the flexible film actuator comprises a flexible electrode 122 and a biasing element 124. Optionally, the flexible film actuator may comprise dielectric elements/layers or additional layers of biasing elements, not shown in FIG. 7. Additionally, if an optional dielectric element is required it may be provided as a layer on the substrate construct disposed between the fixed transparent electrode and the flexible film actuator. It may also be necessary in certain embodiments to include an optional anti-reflective coating in the substrate construct to aid in the transmission of radiation to the detector material.

The detector element 130 comprises a semiconductor material 132 having a doped semiconductor region 134 defined therein. Passivation layer 136 and metal contact 138 will typically be formed on the detector element to provide isolation and electrical signal connectivity, respectively, to the detector element. The detector element is formed on a second semiconductor substrate 140. Optional read-out circuitry and a means of connecting the metal contact to the circuitry, such as a solder bump, may also be implemented in the composite MEMS chopper/shutter photodetector device 100.

After completing construction of the flexible film actuator construct, including the flexible film actuator 120, fixed transparent electrode 150 and first transparent substrate 200 and the detector construct, including the detector element 130 and the second transparent semiconductor substrate 140, the two constructs are joined together by affixing the first and second substrates via solder bumps 210. It is noted that other means of joining the first and second substrates may also be implemented, including epoxy, adhesive bonding, or other suitable support structures, without departing from the inventive concepts herein disclosed.

Figure 8:
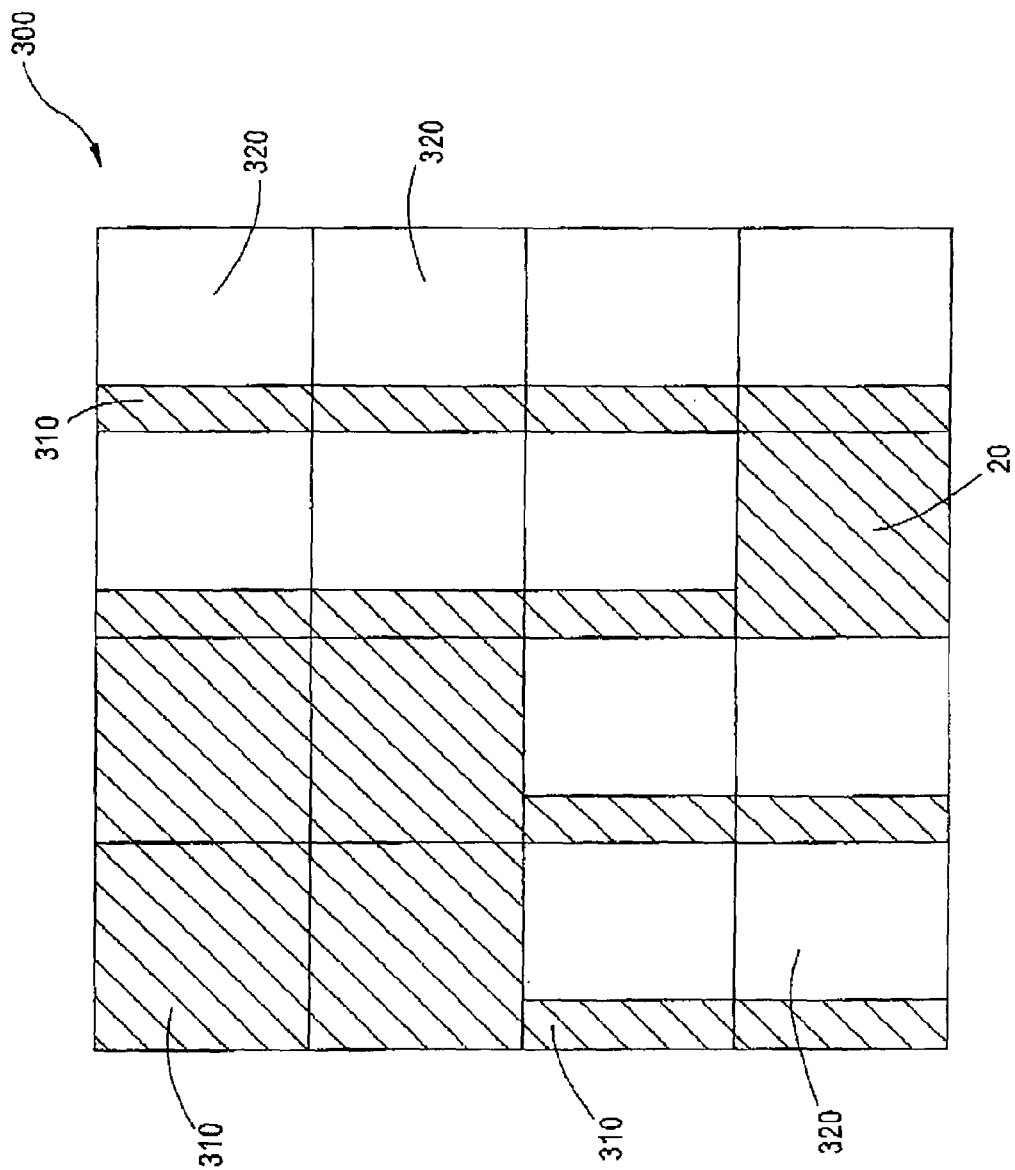
FIG. 8 is a plan view of an electrostatically driven MEMS chopper device array with an underlying focal plane array of electromagnetic radiation detectors in which the individual actuators are associated with individual detectors, in accordance with an embodiment of the present invention.

In accordance with a further embodiment of the present invention, the electrostatically driven MEMS chopper devices are arranged in an array 300 that correspond to an underlying focal plane array (FPA) of detectors. FIG. 8, is a plan view depiction of a 4×4 array of chopper devices in which each flexible flap actuator 310 of the chopper/shutter device corresponds to an individual underlying detector 320 in a 4×4 array of detectors (i.e., pixels). The four flexible film actuators in the upper left-hand corner, as well as a fifth flexible film actuator near the bottom right-hand corner, are depicted as being in the uncurled closed state. In the uncurled closed state the flexible film actuators block passage of electromagnetic radiation to the underlying detectors. The remaining flexible film actuators 310 in the array are depicted as being in the curled open state. In the curled open state the actuators allow passage of electromagnetic radiation to the underlying detector. This array concept could also be applied to larger detector arrays, for example 64×48, 160×120, 320×240, or other larger numbers of pixels.

This type of chopper device array configuration (i.e., 1:1 ratio flexible film actuator to underlying detector) is highly desirable, in that, it provides for radiation modulation of each individual detector/pixel in the array independent of the other detectors/pixels in the array. In this configuration the closed choppers would result in detectors closed off from electromagnetic radiation. The closed-off detectors could be referenced as the background temperature to subtract any noise or temperature fluctuations occurring in the overall FPA. The 1:1 ratio actuator to detector/pixel array is most applicable in applications in which the detector/pixel has a surface area larger than about 100×100 micrometers. This scheme provides a means of noise reduction and compensation for temperature fluctuations in the overall FPA. Additionally, if a "hot spot" (i.e. an area of constant brightness) is detected in an imaging array, this area can be closed independently of the remaining detectors/pixels to zero out the temperature spike in this area. As previously discussed other electromagnetic radiation detectors, besides pyroelectric detectors, that do not typically employ the use of chopping devices may benefit from the noise reduction and increased sensitivity that is imparted by the chopping device of the present invention. Such detectors would include, but are not limited to, thermal microbolometers, photodetectors and the like.

Figure 9:
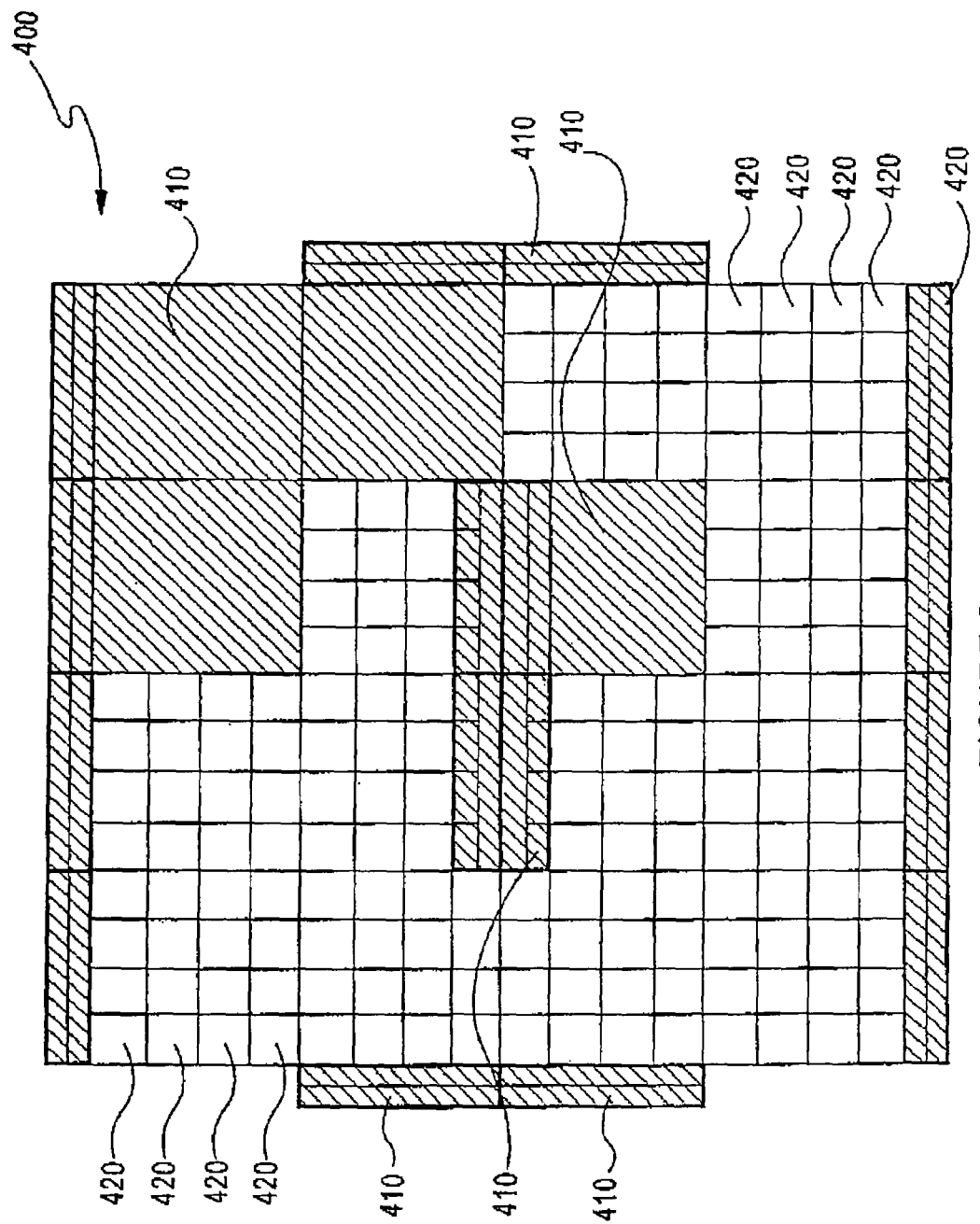
FIG. 9 is a plan view of an electrostatically driven MEMS chopper array With an underlying focal plane array of electromagnetic radiation detectors in which actuators are associated with a plurality of detectors, in accordance with an embodiment of the present invention.

FIG. 9 is an alternate embodiment of an array configuration, in accordance with the present invention. In this array 400 embodiment each flexible film actuator 410 is associated with a grouping of underlying detectors 420. For example, each flexible film actuator will provide chopping capabilities to a 4×4 matrix (i.e. 16 total underlying detectors/pixels). This type of array configuration is desirable in those applications that have FPA detectors/pixels of such small surface area that a 1:1 actuator to detector/pixel ratio would not be feasible. Typically, the type of array shown in FIG. 9 would be conducive to detector/pixels having less than about 100×100 micrometer surface area. In this embodiment flexible film actuators having larger surface area are implemented, some of which are anchored along the periphery of the underlying FPA of detectors. As shown, four of the flexible film actuators are mounted inside the boundary of the underlying detector array; however, the overall fill factor is still greater than 90 percent. Alternatively, actuators with longer distal portions could be used such that all of the actuators are mounted on the periphery of the detector array.

It should be noted that the configurations of the array of electrostatically driven MEMS radiation shutter/chopper devices shown in FIGS. 8 and 9 are by way of example only. Other configurations of arrays, suitable and beneficial to the associated detector array, are also feasible and within the inventive concepts herein disclosed. For example, FIG. 9 shows a detector array of 16×16 pixel/detector elements; however, the chopper device of the present invention may be used for larger arrays with similar schemes. A typical IR imaging FPA will include 320×240 pixel/detector elements.

Figure 10:
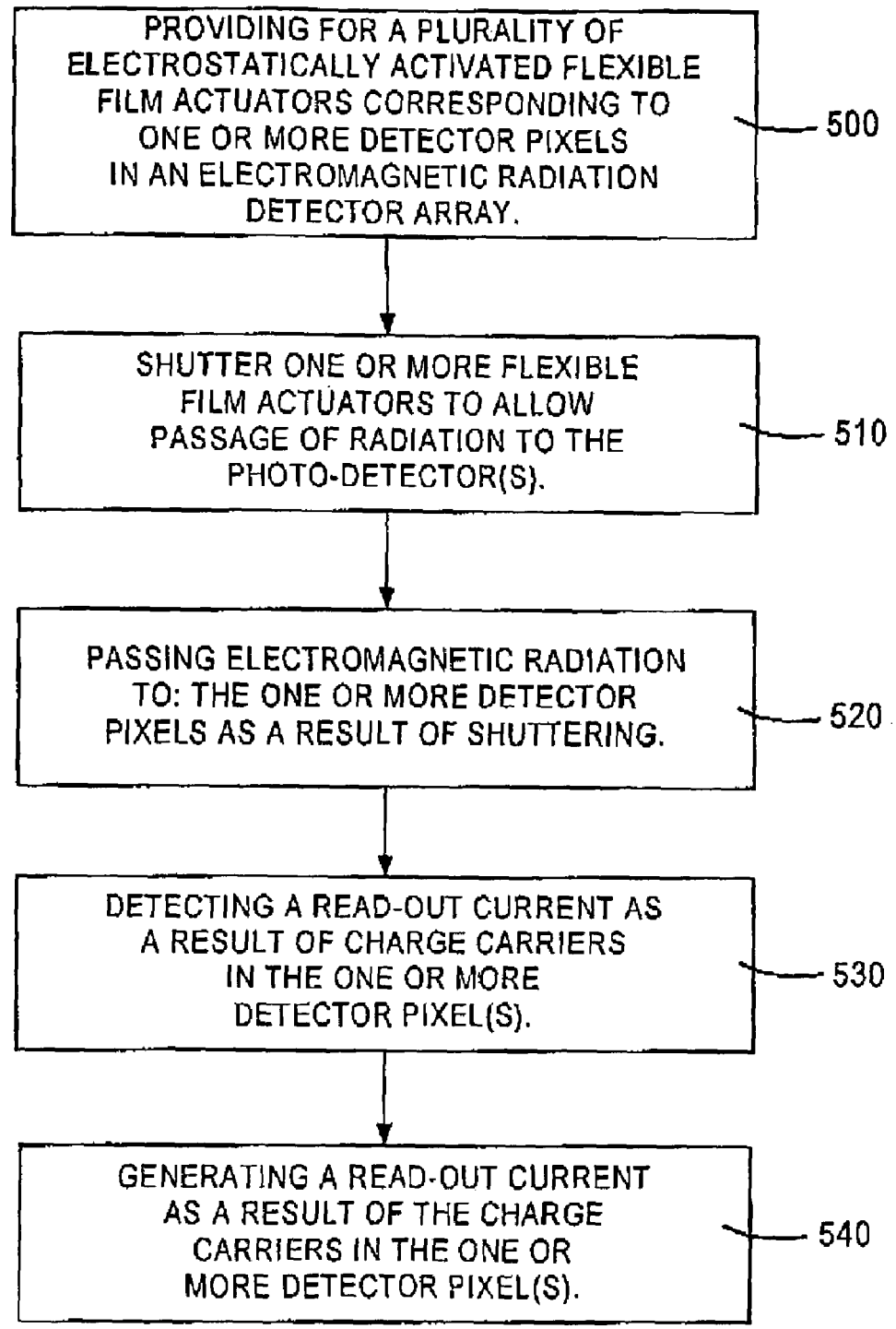
FIG. 10 is a flow diagram of a method for pixel modulation in an electromagnetic radiation imaging focal plane array, in accordance with an embodiment of the present invention.

FIG. 10 is a flow diagram detailing a method for detector/pixel modulation in a radiation imaging focal plane array, in accordance with an embodiment of the present invention. At step 500, a plurality of electrostatically activated flexible film actuators is provided for with each actuator corresponding to one or more detectors in a focal plane array. The flexible film actuators will typically be disposed about the focal plane array of detectors such that one flexible film actuator is associated with one detector/pixel in the array or, alternatively, one flexible film actuator is associated with a plurality of detectors/pixels within the array. At step 510, one or more of the actuators is shuttered to allow the passage of electromagnetic radiation to the one or more underlying detectors. Shuttering involves providing electrostatic voltage to the actuator to cause it move from an open state to a closed state and, subsequently, releasing the voltage to move the actuator from the closed state to the open state.

At step 520, the shuttering of the chopper device to an open state results in the passage of electromagnetic radiation to the detector element. The detectors will typically comprise a photodetector material such as a semiconductor material having a doped region, the semiconductor material including silicon, germanium, mercury-cadmium-tellurium (HgCdTe), gallium arsenide (GaAs), indium antimonide (InSb), other III–V or II–VI compound semiconductors, or the like. At 530, the detector detects photons in the radiation signal and generates charge carriers in response to the photon energy. Once the photon-electron change occurs, at step 540, a read-out current or voltage is generated and is relayed to the read-out circuitry typically disposed in the underlying substrate.

Figure 11A:
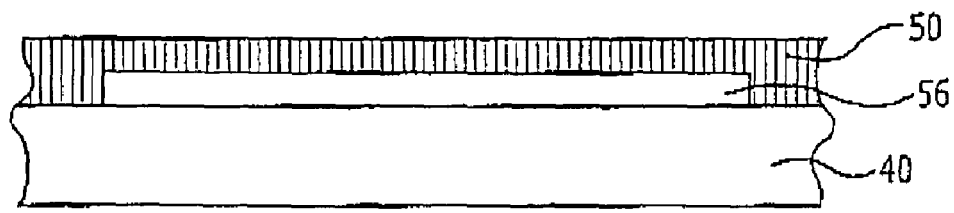
FIGS. 11A–11D are cross-sectional views of various stages in the fabrication process of the electrostatically driven MEMS chopper/shutter device, in accordance with an embodiment of the present invention.

FIGS. 11A–11D illustrate cross-sectional views of various stages in the fabrication process of the uncooled electromagnetic radiation thermal detector having an electrostatically activated MEMS chopper/shutter device, in accordance with an embodiment of the present invention. FIG. 11A illustrates the initial stages of the detector construct in which the substrate 40 has deposited thereon a first sacrificial layer 56 that has been patterned and etched to define the region that will eventually become the air gap 52. Deposited on the first sacrificial layer is a thermal isolation bridge layer 50. The substrate is typically a microelectronic substrate, such as silicon or the like and may embody the signal detection circuitry for the detector. The first sacrificial layer is typically disposed on the substrate using conventional MEMS fabrication techniques, such as evaporation, sputtering or the like and may comprise an oxide, such as silicon oxide or a metal material. Conventional photoresist processing is typically employed to define and etch the regions that will become the legs of the thermal isolation bridge. The thermal isolation bridge layer is characteristically deposited on the sacrificial layer using a standard fabrication process, such as an evaporation or chemical vapor deposition procedure and may comprise a nitride, such as silicon nitride or a metal material.

Figure 11B:
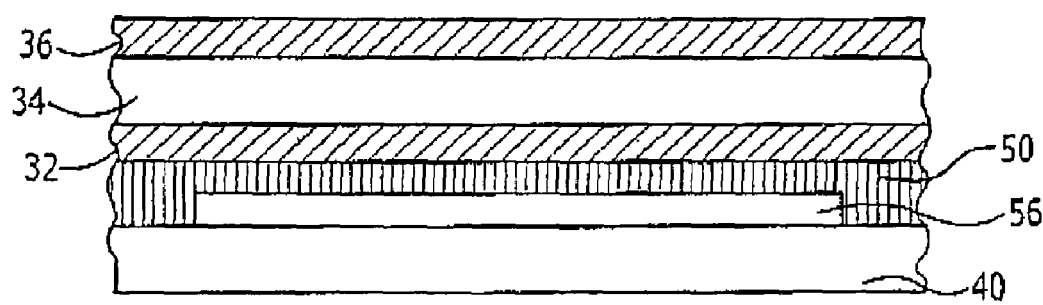

FIG. 11B illustrates the fabrication process after the detector pixel has been formed on the substrate. The detector pixel comprises a first electrode layer 32, a thermal detector material layer 34 and a second electrode layer 34. The first and second electrode layers are deposited using conventional semiconductor fabrication techniques, such as evaporation, sputtering or the like and may comprise gold, platinum, chromium, titanium, LSCO, ruthenium oxide or any other suitable electrode material. The thermal detector material layer is disposed using conventional fabrication techniques such as evaporation, sputtering or, if the detector material layer comprises a sol-gel material, spin coat processing. The thermal detector material layer may comprise lead zirconate titanate (PZT), lithium tantalate (LiTaO$_3$), lead titanium oxide (PbTiO$_3$), barium strontium titanate (BST), polyvinylidene fluoride (PVDF), vanadium oxide or any other suitable detector material may be used to form the detector. Additionally, an electromagnetic radiation absorbing material layer (not shown in FIG. 8) may be disposed on the second electrode layer to facilitate the passage of radiation to the detector element as thermal energy. The absorbing material layer may comprise a black or absorbing polymer material, carbon black, nickel alloy, gold black or another suitable material.

Figure 11C:
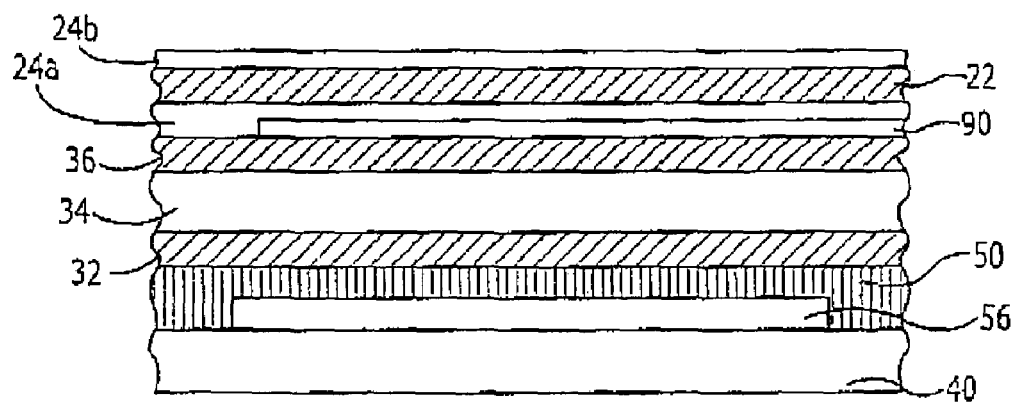

FIG. 11C depicts the fabrication process after the flexible film actuator has been disposed on the substrate. Prior to depositing the flexible film actuator 20 on the detector construct a second sacrificial layer 90 is deposited on the second electrode layer. The second sacrificial layer is typically disposed on the substrate using conventional MEMS fabrication techniques, such as evaporation, sputtering or the like and may comprise an oxide, such as silicon oxide or a metal material. Conventional photoresist processing is typically employed to define and etch the regions that will become the points of attachment for the fixed portion of the flexible film actuator. As shown, the flexible film actuator may comprise an electrode element 22 and first and second biasing elements 24a and 24b. The first and second biasing elements typically comprise a flexible polymeric material, such as polyimide or the like and will generally be deposited as layers using conventional fabrication techniques, such as evaporation, sputtering, spin coating or the like. The electrode element of the flexible film actuator typically comprises a flexible conductive material, such as gold or a conductive polymer and will generally be deposited as layers using conventional fabrication techniques, such as evaporation, sputtering or the like.

Figure 11D:
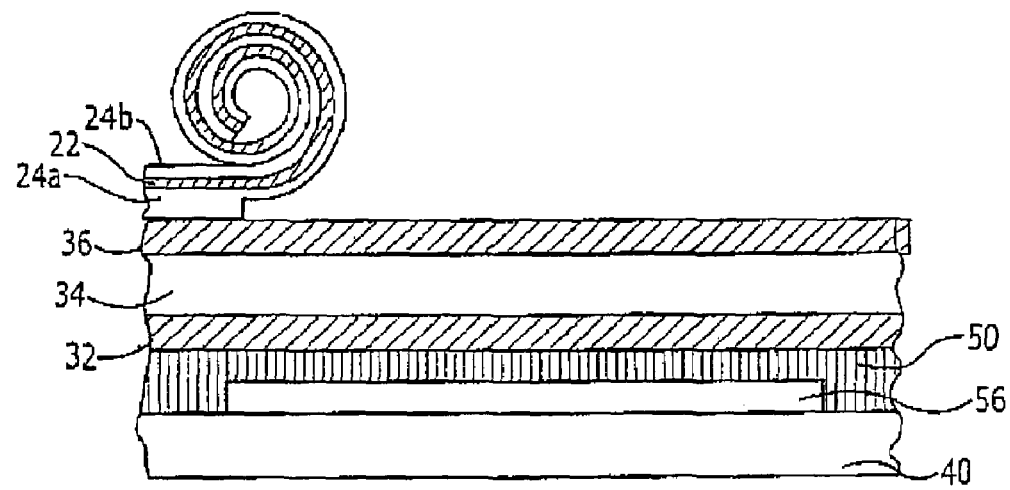

FIG. 11D illustrates completed fabrication of the electromagnetic radiation detector having an electrostatically activated MEMS chopper/shutter device. The first and second sacrificial layers have been removed, typically by exposing the device to an acid solution. Removal of the first sacrificial layer provides for the air gap 52 located between the thermal isolation bridge 50 and the substrate 50. Removal of the second sacrificial layer provides for the release if the distal portion of the flexible film actuator.

Accordingly, the present invention provides for an improved electromagnetic radiation detector having an electrostatically activated chopper/shutter device that will leverage the simplified MEMS fabrication techniques with the advantages of individual shutter/actuator design. Such a design will additionally provide the detector with signal noise reduction, signal gain, faster speed, sensitivity and duty cycle modulation, compensation for temperature fluctuations and background referencing capabilities.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limiting the scope of the present invention in any way.

What is claimed is:

1. An electromagnetic radiation detector device having microelectromechanical system (MEMS) shutter, comprising:
   a detector; and
   a flexible film actuator overlying said detector and moveable relative thereto to alternately allow passage of electromagnetic radiation to said detector and block passage of radiation to said detector.

2. The device of claim 1, further comprising a transparent substrate that supports the detector and that is disposed between the flexible film actuator and the detector.

3. The device of claim 1, wherein the flexible film actuator comprises an underlying transparent electrode disposed between the flexible film actuator and the detector; and
   further comprises an electrode element and a biasing element, the actuator having a fixed portion attached to an underlying surface and a distal portion moveable relative to the underlying transparent electrode.

4. The device of claim 3, further comprising a transparent dielectric element disposed between the electrode element and the underlying transparent electrode.

5. The device of claim 1, further comprising an anti-reflection element disposed between the detector and the flexible film actuator.

6. The device of claim 1, wherein the detector comprises a photo-detector.

7. The device of claim 6, wherein the photo-detector comprises at least one of a photovoltaic detector element and a photoconductive detector element.

8. The device of claim 6, wherein the photo-detector comprises a quantum well infrared photo-detector element.

9. The device of claim 6, wherein the photo-detector further comprises a semiconductor material having a doped region.

10. The device of claim 9, wherein the semiconductor material comprises at least one of silicon, germanium, mercury-cadmium-tellurium (HgCdTe), indium antimonide (InSb), III–V compound semiconductors and II–V compound semiconductors.

11. An electromagnetic radiation detector device having MEMS shutter, the device comprising:
    a first transparent substrate;
    a flexible film actuator disposed on the first transparent substrate;
    a second substrate;
    a detector disposed on the second substrate; and
    one or more solder bumps that serve to connect the first transparent substrate to the second substrate.

12. The device of claim 11, wherein the flexible film actuator further comprises:
    an underlying fixed transparent electrode disposed between the flexible film actuator and the first transparent substrate; and
    a flexible electrode element and a biasing element, the actuator having a fixed portion attached to an underlying surface and a distal portion moveable relative to the underlying fixed transparent electrode.

13. The device of claim 12, further comprising a transparent dielectric element disposed between the flexible electrode element and the underlying fixed transparent electrode.

14. The device of claim 11, further comprising an anti-reflection element disposed between the detector and the flexible film actuator.

15. The device of claim 11, wherein the detector comprises a photo-detector.

16. The device of claim 15, wherein the photo-detector comprises at least one of a photovoltaic detector element and a photoconductive detector element.

17. The device of claim 15, wherein the photo-detector comprises a quantum well infrared photo-detector element.

18. The device of claim 15, wherein the photo-detector element further comprises a semiconductor material having a doped region.

19. The device of claim 18, wherein the semiconductor material comprises at least one of silicon, germanium, mercury-cadmium-tellurium (HgCdTe), indium antimonide (InSb), III–V compound semiconductors and II–V compound semiconductors.

20. An electromagnetic radiation detector array having microelectromechanical system (MEMS) shutter array, comprising:
    a substrate; and
    a plurality of detector pixels supported by said substrate, said detector pixels comprising,
        a detector, and
        a flexible film actuator overlying said detector and moveable relative thereto to alternately allow passage of electromagnetic radiation to said detector and block passage of radiation to said detector.

21. The detector array of claim 20, wherein the substrate further comprises a silicon substrate having a read-out circuit disposed thereon.

22. The detector array of claim 20, wherein the plurality of flexible film actuators further comprise a flexible electrode, a biasing element, and a transparent electrode for a corresponding detector pixel, each actuator having a fixed portion attached to an underlying surface and a distal portion moveable relative to the transparent electrode.

23. The detector array of claim 20, wherein the detector comprises a photo-detector.

24. The detector array of claim 23, wherein the photo-detector comprises at least one of a photovoltaic layer and a photoconductive detector layer.

25. The detector array of claim 24, wherein the photo-detector comprises a quantum well infrared photo-detector layer.

26. The detector array of claim 24, wherein the photo-detector further comprises a semiconductor material having a doped region.

27. The detector array of claim 26, wherein the semiconductor material comprises at least one of silicon, germanium, mercury-cadmium-tellurium (HgCdTe), III–V compound semiconductors and II–V compound semiconductors.

28. A method for pixel modulation in an electromagnetic radiation detector array, the method comprising:
    providing for a plurality of flexible film actuators, each actuator corresponding to one or more detector pixels in an electromagnetic radiation detector array;
    shuttering one or more flexible film actuators to allow passage of electromagnetic radiation to the one or more detector pixels corresponding to the flexible film actuator;
    detecting the electromagnetic radiation in the one or more detector pixels as a result of the shuttering of the corresponding flexible film actuator;
    generating charge carriers in the one or more detector pixels in response to the electromagnetic radiation; and
    generating a read-out signal as a result of the charge carriers in the one or more detector pixels.

29. The method of claim 28, wherein the step of shuttering one or more flexible film actuators comprises:
  deactivating, by releasing the electrostatic force, one or more flexible film actuators to allow passage of electromagnetic radiation to the corresponding one or more detector pixels.

30. The method of claim 28, wherein the step of generating a read-out signal further comprises:
  generating a read-out voltage signal.

31. The method of claim 28, wherein the step of generating a read-out signal further comprises:
  generating a read-out current value.

32. The method of claim 28, wherein the step of shuttering of the one or more flexible film actuators provides intermittent open (on) or blocked (off) states in the one or more photo-detector pixels.

33. The method of claim 28, wherein the step of shuttering comprises:
  chopping of the incident electromagnetic radiation at a continuous frequency to the one or more detector pixels.

34. The device of claim 2, wherein the detector is disposed on a side of the transparent substrate opposite the actuator.

35. The device of claim 11, wherein the detector is disposed on a side of the second transparent substrate opposite the actuator.

36. The detector array of claim 20, wherein the substrate comprises a transparent substrate and the plurality of detector pixels are disposed on a side of the transparent substrate opposite the flexible film actuator.

37. The method of claim 28, wherein the step of shuttering comprises:
  opening one or more flexible film actuators to allow passage of electromagnetic radiation through a transparent substrate to the one or more detector pixels disposed on a side of transparent substrate opposite the flexible film actuators.

38. The device of claim 1, wherein the detector comprises an infrared detector detector.

39. The device of claim 38, wherein the infrared detector comprises at least one of a pyroelectric detector and a bolometer.

40. The device of claim 38, wherein the infrared detector comprises:
  a material including at least one of lead zirconate titanate (PZT), lithium tantalate (LiTaO$_3$), lead titanium oxide (PbTiO$_3$), barium strontium titanate (BST), polyvinylidene fluoride (PVDF) and vanadium oxide.

41. The device of claim 11, wherein the detector comprises an infrared detector detector.

42. The device of claim 41, wherein the infrared detector comprises at least one of a pyroelectric detector and a bolometer.

43. The device of claim 41, wherein the infrared detector comprises:
  a material including at least one of lead zirconate titanate (PZT), lithium tantalate (LiTaO$_3$), lead titanium oxide (PbTiO$_3$), barium strontium titanate (BST), polyvinylidene fluoride (PVDF) and vanadium oxide.

44. The detector array of claim 20, wherein the detector comprises an infrared detector.

45. The device of claim 44, wherein the infrared detector comprises at least one of a pyroelectric detector and a bolometer.

46. The detector array of claim 20, wherein the infrared detector comprises:
  a material including at least one of lead zirconate titanate (PZT), lithium tantalate (LiTaO$_3$), lead titanium oxide (PbTiO$_3$), barium strontium titanate (BST), polyvinylidene fluoride (PVDF) and vanadium oxide.

* * * * *